(12) United States Patent
Takeda et al.

(10) Patent No.: US 6,949,323 B2
(45) Date of Patent: Sep. 27, 2005

(54) RESIST COMPOSITION AND PATTERNING PROCESS

(75) Inventors: Takanobu Takeda, Niigata-ken (JP); Osamu Watanabe, Niigata-ken (JP); Kazunori Maeda, Niigata-ken (JP); Hiroshi Miyakoshi, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/283,263

(22) Filed: Oct. 30, 2002

(65) Prior Publication Data

US 2003/0118934 A1 Jun. 26, 2003

(30) Foreign Application Priority Data

Oct. 30, 2001 (JP) ........................................ 2001-331757

(51) Int. Cl.[7] ............................................... G03F 7/004
(52) U.S. Cl. .................... 430/270.1; 430/325; 430/326; 430/905; 430/907; 430/910
(58) Field of Search .............................. 430/270.1, 325, 430/926, 905, 910, 907, 326

(56) References Cited

U.S. PATENT DOCUMENTS

| | | | |
|---|---|---|---|
| 4,491,628 A | | 1/1985 | Ito et al. |
| 5,310,619 A | | 5/1994 | Crivello et al. |
| 5,972,559 A | * | 10/1999 | Watanabe et al. ........ 430/270.1 |
| 6,045,970 A | * | 4/2000 | Choi ........................ 430/270.1 |
| 6,280,900 B1 | | 8/2001 | Chiba et al. |
| 6,281,318 B1 | * | 8/2001 | Yamamoto et al. ......... 526/313 |
| 6,537,719 B1 | * | 3/2003 | Takahashi ................... 430/191 |
| 6,579,659 B2 | * | 6/2003 | Uetani et al. ............ 430/270.1 |
| 6,869,748 B2 | * | 3/2005 | Takeda et al. ........... 430/270.1 |

FOREIGN PATENT DOCUMENTS

| | | |
|---|---|---|
| EP | 0 440 374 A2 | 8/1991 |
| JP | 59199705 | 12/1984 |
| JP | 62-115440 A | 5/1987 |
| JP | 63-27829 A | 2/1988 |
| JP | 2-27660 B2 | 6/1990 |
| JP | 3-223858 A | 10/1991 |
| JP | 3-275149 A | 12/1991 |
| JP | 4-211258 A | 8/1992 |
| JP | 6-100488 A | 4/1994 |
| JP | 6-289608 A | 10/1994 |
| JP | 2003-57826 A * | 2/2003 ........... G03F/7/039 |

OTHER PUBLICATIONS

XP–002231989 Derwent Publication Ltd., London, GB, AN2000–621796. JP 2000 231193.
XP–002231990 Derwent Publication Ltd., London, GB, AN1992–320780. JP 2951744.

* cited by examiner

*Primary Examiner*—Yvette C. Thornton
(74) *Attorney, Agent, or Firm*—Birch, Stewart, Kolasch & Birch, LLP

(57) ABSTRACT

Resist compositions comprising as the base resin a polymer using tert-amyloxystyrene as a reactive group which is decomposable under the action of an acid to increase solubility in alkali have advantages including a significantly enhanced contrast of alkali dissolution rate before and after exposure, a high sensitivity, and a high resolution in the baking temperature range of 100–110° C. which is unachievable with tert-butoxystyrene. The compositions are best suited as a chemically amplified resist material for micropatterning in the manufacture of VLSI.

12 Claims, No Drawings

RESIST COMPOSITION AND PATTERNING PROCESS

This invention relates to a resist composition, typically chemically amplified positive resist composition suitable for the fabrication of VLSI, comprising as the base resin a polymer containing tert-amyloxystyrene as a reactive group which is decomposable under the action of an acid to increase solubility in alkali, the composition having a wide temperature range for baking, a significantly high contrast of alkali dissolution rate before and after exposure, a high sensitivity, a high resolution, and improved etch resistance; and a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.5 μm or less and, when a resist having low light absorption is used, can form patterns with sidewalls that are nearly perpendicular to the substrate.

Recently developed acid-catalyzed chemical amplification positive resists, such as those described in JP-B 2-27660, JP-A 63-27829, U.S. Pat. Nos. 4,491,628 and 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 62-115440 describes a resist material comprising poly-4-tert-butoxystyrene and a photoacid generator, and JP-A 3-223858 describes a similar two-component resist material comprising a resin bearing tert-butoxy groups within the molecule, in combination with a photoacid generator. JP-A 4-211258 describes a two-component resist material which is comprised of polyhydroxystyrene bearing methyl, isopropyl, tert-butyl, tetrahydropyranyl, and trimethylsilyl groups, together with a photoacid generator.

JP-A 6-100488 discloses a resist material comprised of a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

The base resins in these resist materials have an optimum baking temperature as high as about 130° C. when the acid labile group is tert-butyl, and low resolution when the acid labile group is tert-butoxycarbonyl. In either case, the resist pattern tends to take on a T-top profile. By contrast, when the acid labile groups are alkoxyalkyl groups such as ethoxyethyl which are cleaved by weak acids, the corresponding resins have the drawback that the pattern configuration is considerably narrowed with the passage of time between exposure and heat treatment. This makes it difficult to form a resist film to a reduced thickness compliant with a reduced feature size. Moreover, the presence of bulky groups on the side chains lowers the heat resistance of the resin and leads to an unsatisfactory sensitivity and resolution. These problems have hitherto prevented the practical implementation of either approach, and workable solutions have been sought.

To provide higher transparency and firm adhesion to substrates and to improve footing on substrates and etching resistance, JP-A 3-275149 and 6-289608 propose resist materials using copolymers of hydroxystyrene with a tertiary ester of (meth)acrylic acid. The resist materials of this type suffer from poor heat resistance and an indefinite pattern profile after exposure and are not satisfactory in resolution as well.

With the current trend toward higher resolution, thinning of pattern film is in simultaneous progress. Accordingly, there is a desire to have a resist material having higher etching resistance.

SUMMARY OF THE INVENTION

An object of the invention is to provide a resist composition, especially chemically amplified positive resist composition, which is superior to prior art positive resist compositions in sensitivity, resolution, exposure latitude and process flexibility, and has a satisfactory pattern profile after exposure and a wide temperature range for baking.

It has been found that a polymer having recurring units of the general formula (1) or (2), shown below, and having a weight average molecular weight of 1,000 to 500,000 is an effective base resin in a positive resist composition, especially chemically amplified positive resist composition. The chemically amplified positive resist composition containing a photoacid generator and an organic solvent as well as the polymer has many advantages including an increased dissolution contrast of a resist film, high resolution, improved latitude of exposure, a wide temperature range for baking, improved process flexibility, a good pattern profile after exposure, and an ability to form a resist film of reduced thickness compliant with a reduced feature size. The composition is thus suited for practical use and advantageously used in precise microfabrication, especially in VLSI manufacture.

In a first aspect, the invention provides a resist composition comprising a polymer comprising recurring units of the following general formula (1) and having a weight average molecular weight of 1,000 to 500,000.

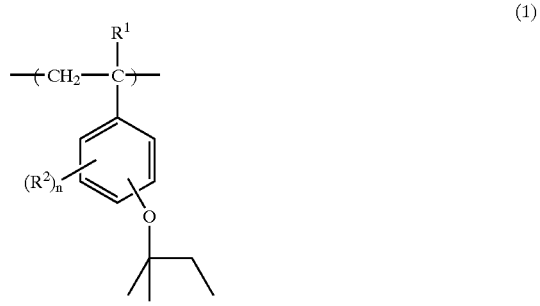

(1)

Herein $R^1$ is hydrogen, hydroxy, straight or branched alkyl, halogen or trifluoromethyl, $R^2$ is hydrogen, hydroxy, halogen or trifluoromethyl, and n is 0 or a positive integer of 1 to 4.

A resist composition comprising a polymer comprising recurring units of the following general formula (2) and having a weight average molecular weight of 1,000 to 500,000 is also contemplated.

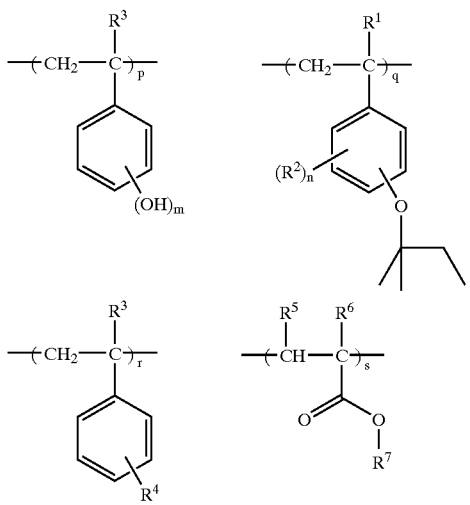

(2)

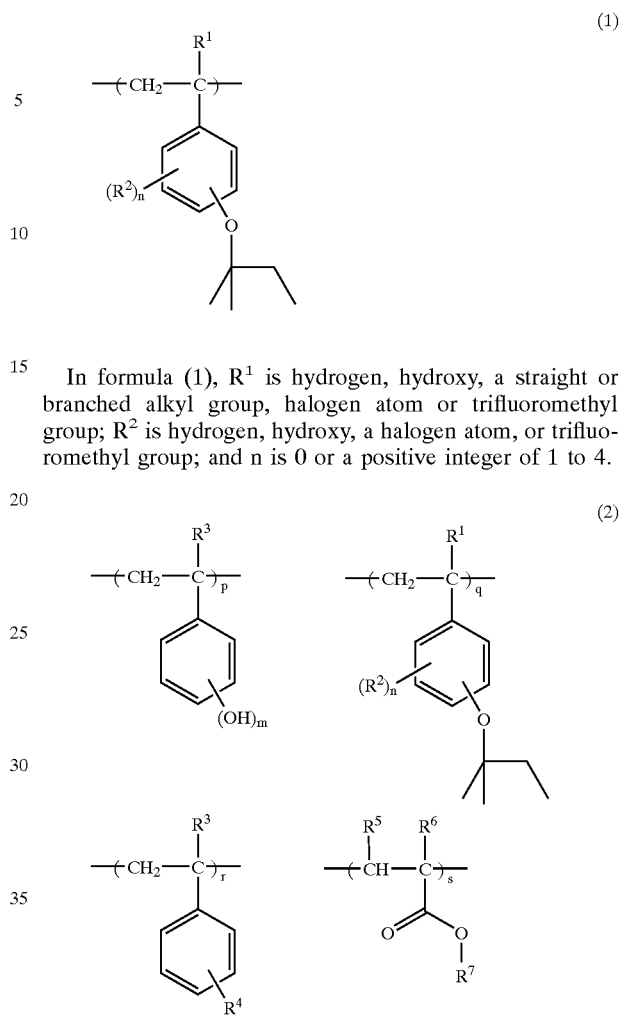

Herein each of $R^1$ and $R^3$ is hydrogen, hydroxy, straight or branched alkyl, halogen or trifluoromethyl, $R^2$ is hydrogen, hydroxy, halogen or trifluoromethyl, $R^4$ is hydrogen, halogen, trifluoromethylhydroxymethyl or —OR, R is a straight, branched or cyclic alkyl group which may contain a hetero atom, alkoxyalkyl group, alkoxycarbonyl group or trialkylsilyl group, $R^5$ is hydrogen or methyl, $R^6$ is hydrogen, methyl, alkoxycarbonyl, cyano, halogen, or trifluoromethyl, $R^7$ is a straight, branched or cyclic alkyl group of 4 to 30 carbon atoms, n is 0 or a positive integer of 1 to 4, m is 0 or a positive integer of 1 to 5, each of p, r and s is 0 or a positive number, and q is a positive number.

In a second aspect, the invention provides a chemically amplified positive resist composition comprising (A) an organic solvent, (B) the polymer defined above as a base resin, and (C) a photoacid generator; or a chemically amplified positive resist composition comprising (A) an organic solvent, (B) the polymer defined above as a base resin, (C) a photoacid generator, and (D) a dissolution inhibitor. The chemically amplified positive resist composition may further include (E) a basic compound.

In a third aspect, the invention provides a process for forming a resist pattern comprising the steps of applying the resist composition onto a substrate to form a coating; heat treating the coating and then exposing it to high-energy radiation or electron beam through a photo mask; and optionally heat treating the exposed coating and developing it with a developer.

DESCRIPTION OF THE PREFERRED EMBODIMENT

The resist compositions of the invention are typically of the positive working type, and especially of the chemically amplified positive working type. The compositions include polymers or high molecular weight compounds comprising recurring units of the following general formula (1), preferably the following general formula (2), and having a weight average molecular weight of 1,000 to 500,000, as the base resin.

In formula (1), $R^1$ is hydrogen, hydroxy, a straight or branched alkyl group, halogen atom or trifluoromethyl group; $R^2$ is hydrogen, hydroxy, a halogen atom, or trifluoromethyl group; and n is 0 or a positive integer of 1 to 4.

In formula (2), each of $R^1$ and $R^3$ is hydrogen, hydroxy, a straight or branched alkyl group, halogen atom or trifluoromethyl group; $R^2$ is hydrogen, hydroxy, a halogen atom or trifluoromethyl group; $R^4$ is hydrogen, halogen atom, trifluoromethylhydroxymethyl group or —OR; R is a straight, branched or cyclic alkyl group which may contain a hetero atom (e.g., oxygen atom), alkoxyalkyl group, alkoxycarbonyl group or trialkylsilyl group; $R^5$ is hydrogen or methyl; $R^6$ is hydrogen, methyl, alkoxycarbonyl group, cyano group, halogen atom, or trifluoromethyl group; $R^7$ is a straight, branched or cyclic alkyl group of 4 to 30 carbon atoms; n is 0 or a positive integer of 1 to 4, m is 0 or a positive integer of 1 to 5, each of p, r and s is 0 or a positive number, and q is a positive number.

As used herein, the straight or branched alkyl groups are, for example, methyl, ethyl, propyl, isopropyl, n-butyl, isobutyl and tert-butyl.

When $R^4$ stands for —OR which exhibits a function of acid labile group, R is selected from a variety of groups, preferably from among groups of formulae (3) and (4) shown below, straight, branched or cyclic tertiary alkyl groups of 4 to 20 carbon atoms, oxoalkyl groups of 4 to 20 carbon atoms, tetrahydropyranyl, tetrahydrofuranyl, and trialkylsilyl groups in which each alkyl has 1 to 6 carbon atoms.

(3)
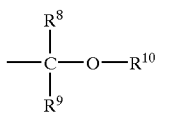

(4)
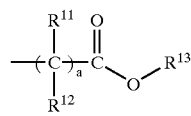

In formulae (3) and (4), $R^8$, $R^9$, $R^{11}$ and $R^{12}$ are each independently selected from hydrogen and straight or branched alkyl groups having 1 to 8 carbon atoms; and $R^{10}$ is a monovalent hydrocarbon group of 1 to 18 carbon atoms, such as alkyl, which may be separated by an oxygen atom. A pair of $R^8$ and $R^9$, $R^8$ and $R^{10}$, or $R^9$ and $R^{10}$, taken together, may form a ring; and each of $R^8$, $R^9$ and $R^{10}$ is a straight or branched alkylene group having 1 to 18 carbon atoms when they form a ring. $R^{13}$ is a straight, branched or cyclic alkyl group of 4 to 40 carbon atoms. The subscript "a" is 0 or a positive integer of 1 to 4.

Illustrative, non-limiting, examples of the acid labile group having formula (3) include methoxyethyl, ethoxyethyl, n-propoxyethyl, iso-propoxyethyl, n-butoxyethyl, iso-butoxyethyl, tert-butoxyethyl, cyclohexyloxyethyl, methoxypropyl, ethoxypropyl, 1-methoxy-1-methyl-ethyl, and 1-ethoxy-1-methyl-ethyl. Illustrative, non-limiting, examples of the acid labile group having formula (4) include tert-butoxycarbonyl, tert-butoxycarbonylmethyl, ethylcyclopentyloxycarbonyl, ethylcyclohexyloxycarbonyl and methylcyclopentyloxycarbonyl.

Referring to formulae (1) and (2) again, when $R^1$, $R^2$, $R^3$, $R^4$ and $R^6$ stand for halogen atoms, the preferred halogen atoms are fluorine, chlorine and bromine.

When the alkyl group represented by $R^7$ is tertiary, it is selected from many tertiary alkyl groups, especially groups of the following formulae (5) and (6).

(5)
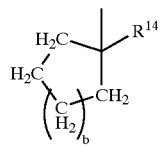

In formula (5), $R^{14}$ is methyl, ethyl, isopropyl, cyclohexyl, cyclopentyl, vinyl, acetyl, phenyl, benzyl or cyano, and "b" is an integer of 0 to 3.

Illustrative examples of the cyclic alkyl group of formula (5) include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexeyl and 1-cyanocyclohexyl. Of these, 5-membered rings are most preferred.

(6)

In formula (6), $R^{15}$ is methyl, ethyl, isopropyl, cyclohexyl, cyclopentyl, vinyl, phenyl, benzyl or cyano.

Illustrative examples of the alkyl group of formula (6) include t-butyl, 1-vinyldimethylmethyl, 1-benzyldimethylmethyl, 1-phenyldimethylmethyl, and 1-cyanodimethylmethyl.

Alkyl groups capable of forming tertiary esters represented by formulae (5)-1 to (5)-4 are also preferred as $R^7$.

(5)-1

(5)-2

(5)-3

(5)-4

In order for the resist composition to exhibit better properties, q in formula (2) is a positive number, and each of p, r and s is 0 or a positive number, and they should preferably satisfy the relationship:

$0<q/(p+q+r+s)\leq0.5$, especially $0<q/(p+q+r+s)\leq0.3$;
$0\leq p/(p+q+r+s)\leq0.8$, especially $0.3\leq p/(p+q+r+s)\leq0.8$;
$0\leq r/(p+q+r+s)\leq0.35$; and
$0\leq s/(p+q+r+s)\leq0.35$, with the proviso that $p+q+r+s=1$.

If q=0, meaning that the polymer of formula (2) does not contain the corresponding units, the contrast of alkali dissolution rate before and after exposure is lost, detracting from resolution. If the proportion of p is more than 0.8, the alkali dissolution rate in unexposed areas may become too high. By properly selecting the values of p, q, r and s within the above range, the size and configuration of a resist pattern can be controlled as desired.

The polymer of the invention should have a weight average molecular weight of 1,000 to 500,000, preferably 2,000 to 30,000. With too low a weight average molecular weight, resists may be less resistant to heat. With too high a weight average molecular weight, alkali solubility lowers and a footing phenomenon often occurs after pattern formation.

It is recommended that a multi-component copolymer of formula (2) have a controlled molecular weight dispersity (Mw/Mn). If a copolymer has a wide dispersity, it contains more fractions of low molecular weight and high molecular weight polymers and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 2.0, especially 1.0 to 1.5.

In one typical embodiment, the polymer can be synthesized by dissolving an acetoxystyrene monomer, a (meth) acrylic acid tertiary ester monomer and an amyloxystyrene monomer in an organic solvent, adding a radical initiator thereto, heat polymerizing the monomers, and subjecting the resulting polymer to alkaline hydrolysis in an organic solvent for deblocking the acetoxy group, thereby forming a ternary copolymer of hydroxystyrene, (meth)acrylic acid tertiary ester and amyloxystyrene. Examples of the organic solvent used in polymerization include toluene, benzene, tetrahydrofuran, diethyl ether, and dioxane. Representative of the polymerization initiator are 2,2'-azobisisobutyronitrile, 2,2'-azobis(2,4-dimethyl-valeronitrile), dimethyl-2,2-azobis(2-methylpropionate), benzoyl peroxide and lauroyl peroxide. Polymerization may be effected by heating at about 50 to 80° C. The reaction time is usually about 2 to 100 hours, preferably about 5 to 20 hours. The base used in the alkaline hydrolysis is selected from aqueous ammonia and triethylamine, to name a few. The reaction temperature is about −20° C. to 100° C., preferably about 0 to 60° C. The reaction time is usually about 0.2 to 100 hours, preferably about 0.5 to 20 hours.

After the polymer produced in this way is isolated, it is possible to introduce acid labile groups of formula (3) or (4) into phenolic hydroxyl moieties on the polymer. For example, a halogenated alkyl ether compound can be used to react with phenolic hydroxyl groups on the polymer in the presence of a base, obtaining a polymer in which some phenolic hydroxyl groups are protected with alkoxyalkyl groups. The reaction solvent used herein is preferably an aprotic polar solvent such as acetonitrile, acetone, dimethylformamide, dimethylacetamide, tetrahydrofuran or dimethyl sulfoxide, alone or in admixture. The base used herein is preferably selected from among triethylamine, pyridine, diisopropylamine and potassium carbonate, and is used in an amount of at least 10 mol % based on the total moles of phenolic hydroxyl groups on the polymer. The reaction temperature is about −50° C. to 100° C., preferably about 0 to 60° C. The reaction time is usually about 0.5 to 100 hours, preferably about 1 to 20 hours.

It is also possible to introduce acid labile groups of formula (4) by reacting a dialkyl dicarbonate or alkoxycarbonylalkyl halide with the polymer in a solvent in the presence of a base. The reaction solvent used herein is preferably an aprotic polar solvent such as acetonitrile, acetone, dimethylformamide, dimethylacetamide, tetrahydrofuran or dimethyl sulfoxide, alone or in admixture. The base used herein is preferably selected from among triethylamine, pyridine, imidazole, diisopropylamine and potassium carbonate, and is used in an amount of at least 10 mol % based on the total moles of phenolic hydroxyl groups on the polymer. The reaction temperature is about 0° C. to 100° C., preferably about 0 to 60° C. The reaction time is usually about 0.2 to 100 hours, preferably about 1 to 10 hours.

Exemplary dialkyl dicarbonate compounds are di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, and tert-butoxycarbonylethyl chloride.

It is noted that the synthesis procedure is not limited to the aforementioned.

The resist composition of the invention can be prepared to any well-known formulation except that the above-defined polymer is used as the base resin. Well-known components may be used. Particularly when a chemically amplified positive resist composition is desired, it is comprised of (A) an organic solvent, (B) the polymer defined above as a base resin, and (C) a photoacid generator. Optionally, the composition further includes (D) a dissolution inhibitor and preferably (E) a basic compound.

In the chemically amplified, positive working resist composition of the invention, component (A) is an organic solvent. Illustrative, non-limiting, examples include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxy-butanol, N-methylpyrrolidone, dimethylsulfoxide, γ-butyrol-actone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate.

It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)-phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo-[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n- butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (C) is 0.5 to 20 parts, more preferably 1 to 10 parts by weight per 100 parts by weight of the base resin (A) in the composition. The photoacid generators may be used alone or in admixture of two or more. The transmittance of the resist film can be controlled by using a photoacid generator having a low transmittance at the exposure wavelength and adjusting the amount of the photoacid generator added.

The dissolution inhibitor (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution inhibitor may fail to yield an improved resolution, whereas too much amounts would lead to slimming of the patterned film, and thus a decline in resolution.

Illustrative, non-limiting, examples of the dissolution inhibitor (D) which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \quad \quad (B)-1$$

In the formula, n is equal to 1, 2 or 3; the side chain Y is independently hydrogen or a straight, branched or cyclic alkyl group of 1 to 20 carbon atoms which may contain a hydroxyl group or ether; and the side chain X is independently selected from groups of the following general formulas (X)-1 to (X)-3.

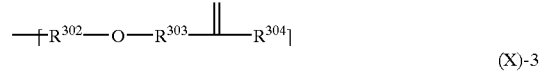

In the formulas, $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyl-oxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2- hydroxyethyl)-2-[(methoxycarbonyl)methoxycarbonyl] ethylamine, N,N-bis(2-acetoxyethyl)-2-[(methoxycarbonyl) methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl) ethylamine, N,N-bis(2-methoxyethyl)-2-(methoxycarbonyl) ethylamine, N-(2-hydroxyethyl)-bis[2-(methoxycarbonyl) ethyl]amine, N-(2-acetoxyethyl)-bis[2-(methoxycarbonyl) ethyl]amine, N-(2-hydroxyethyl)-bis[2-(ethoxycarbonyl) ethyl]amine, N-(2-acetoxyethyl)-bis[2-(ethoxycarbonyl) ethyl]amine, N-(3-hydroxy-1-propyl)-bis[2-(methoxycarbonyl)ethyl]amine, N-(3-acetoxy-1-propyl)-bis [2-(methoxycarbonyl)ethyl]amine, N-(2-methoxyethyl)-bis [2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris (methoxycarbonylmethyl)amine, tris (ethoxycarbonylmethyl)amine, N-butyl-bis (methoxycarbonylmethyl)amine, N-hexyl-bis (methoxycarbonylmethyl)amine, and β-(diethylamino)-δ-valerolactone.

The basic compounds may be used alone or in admixture of two or more. The basic compound is preferably formulated in an amount of 0 to 2 parts, and especially 0.01 to 1 part by weight, per 100 parts by weight of the solids in the resist composition. The use of more than 2 parts of the basis compound would result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products K.K.), Megaface F171, F172 and F173 (Dai-Nippon Ink & Chemicals K.K.), Florade FC430 and FC431 (Sumitomo 3M K.K.), Asahiguard AG710, Surflon S-381, S-382, SC101, SC102, SC103, SC104, SC105, SC106, Surfynol E1004, KH-10, KH-20, KH-30 and KH-40 (Asahi Glass K.K.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin in the resist composition.

For the microfabrication of integrated circuits, any well-known lithography may be used to form a resist pattern from the chemical amplification, positive working, resist composition comprising (A) an organic solvent, (B) the polymer comprising recurring units of formula (1) or (2), and (C) a photoacid generator, as illustrated above, according to the invention.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, soft x-rays, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation. The abbreviation AIBN is azobisisobutyronitrile, Mw is a weight average molecular weight, Mn is a number average molecular weight, Mw/Mn is a molecular weight dispersity, NMR is nuclear magnetic resonance, GPC is gel permeation chromatography.

Synthesis Example 1

To a 2-liter flask were added 66.5 g of p-acetoxystyrene, 33.5 g of p-tert-amyloxystyrene and 200 g of toluene as a solvent. The reactor was cooled to −70° C. in a nitrogen atmosphere, whereupon vacuum deaeration and nitrogen blow were repeated three times. The reactor was warmed up to room temperature, 3.9 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 92 g of a white polymer. The polymer was dissolved in a mixture of 0.27 liter methanol and 0.27 liter tetrahydrofuran again, to which 77 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 61 g of a white polymer was obtained.

The polymer was analyzed by $^{13}$C-NMR, $^{1}$H-NMR and GPC, with the analytical results shown below.

Copolymer compositional ratio=hydroxystyrene:p-tert-amyloxystyrene=72.5:27.5 Mw=16,100 Mw/Mn=1.73

This polymer is designated Poly-A.

Synthesis Example 2

To a 2-liter flask were added 71.5 g of p-acetoxystyrene, 22.4 g of p-tert-amyloxystyrene, 8.1 g of 1-ethylcyclopentyl methacrylate and 200 g of toluene as a solvent. The reactor was cooled to −70° C. in a nitrogen atmosphere, whereupon vacuum deaeration and nitrogen blow were repeated three times. The reactor was warmed up to room temperature, 3.9 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 89 g of a white polymer. The polymer was dissolved in a mixture of 0.27 liter methanol and 0.27 liter tetrahydrofuran again, to which 77 g of triethylamine and 14 g of water were added to effect deblocking reaction. The reaction solution was neutralized with acetic acid, concentrated, and dissolved in 0.5 liter of acetone. Following precipitation, filtration and drying in the same way as above, 55 g of a white polymer was obtained.

The polymer was analyzed by $^{13}$C-NMR, $^{1}$H-NMR and GPC, with the analytical results shown below.

Copolymer compositional ratio=hydroxystyrene:p-tert-amyloxystyrene:1-ethylcyclopentyl methacrylate=70.9:21.9:7.2 Mw=17,000 Mw/Mn=1.70

This polymer is designated Poly-B.

Synthesis Example 3

To a 2-liter flask were added 71.6 g of p-acetoxystyrene, 22.4 g of p-tert-amyloxystyrene, 6.1 g of 1-ethylnorbornyl methacrylate and 200 g of toluene as a solvent. The reactor was cooled to −70° C. in a nitrogen atmosphere, whereupon vacuum deaeration and nitrogen blow were repeated three times. The reactor was warmed up to room temperature, 3.9 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 85 g of a white polymer. The polymer was dissolved in a mixture of 0.27 liter methanol and 0.27 liter tetrahydrofuran again, to which 77 g of triethylamine and 14 g of water were added to effect deblocking reaction. The reaction solution was neutralized with acetic acid, concentrated, and dissolved in 0.5 liter of acetone. Following precipitation, filtration and drying in the same way as above, 52 g of a white polymer was obtained.

The polymer was analyzed by $^{13}$C-NMR, $^{1}$H-NMR and GPC, with the analytical results shown below.

Copolymer compositional ratio=hydroxystyrene:p-tert-amyloxystyrene:1-ethylnorbornyl methacrylate=73.8:21.9:4.3 Mw=17,500 Mw/Mn=1.66

This polymer is designated Poly-C.

Synthesis Example 4

To a 2-liter flask were added 71.1 g of p-acetoxystyrene, 16.7 g of p-tert-amyloxystyrene, 12.2 g of 1-ethylnorbornyl methacrylate and 200 g of toluene as a solvent. The reactor was cooled to −70° C. in a nitrogen atmosphere, whereupon vacuum deaeration and nitrogen blow were repeated three times. The reactor was warmed up to room temperature, 3.8 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 83 g of a white polymer. The polymer was dissolved in a mixture of 0.27 liter methanol and 0.27 liter tetrahydrofuran again, to which 77 g of triethylamine and 14 g of water were added to effect deblocking reaction. The reaction solution was neutralized with acetic acid, concentrated, and dissolved in 0.5 liter of acetone. Following precipitation, filtration and drying in the same way as above, 50 g of a white polymer was obtained.

The polymer was analyzed by $^{13}$C-NMR, $^{1}$H-NMR and GPC, with the analytical results shown below.

Copolymer compositional ratio=hydroxystyrene:p-tert-amyloxystyrene:1-ethylnorbornyl methacrylate=75.9:16.1:7.9 Mw=17,700 Mw/Mn=1.70

This polymer is designated Poly-D.

Synthesis Example 5

To a 2-liter flask were added 69.1 g of p-acetoxystyrene, 22.0 g of p-tert-amyloxystyrene, 8.3 g of 1-ethyladamantyl methacrylate and 200 g of toluene as a solvent. The reactor was cooled to −70° C. in a nitrogen atmosphere, whereupon vacuum deaeration and nitrogen blow were repeated three times. The reactor was warmed up to room temperature, 3.8 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 87 g of a white polymer. The polymer was dissolved in a mixture of 0.27 liter methanol and 0.27 liter tetrahydrofuran again, to which 77 g of triethylamine and 14 g of water were added to effect deblocking reaction. The reaction solution was neutralized with acetic acid, concentrated, and dissolved in 0.5 liter of acetone. Following precipitation, filtration and drying in the same way as above, 53 g of a white polymer was obtained.

The polymer was analyzed by $^{13}$C-NMR, $^{1}$H-NMR and GPC, with the analytical results shown below.

Copolymer compositional ratio=hydroxystyrene:p-tert-amyloxystyrene:1-ethyladamantyl methacrylate=73.1:23.1:3.8 Mw=16,300 Mw/Mn=1.78

This polymer is designated Poly-E.

Synthesis Example 6

To a 2-liter flask were added 68.3 g of p-acetoxystyrene, 20.4 g of p-tert-amyloxystyrene, 5.3 g of p-ethoxyethoxystyrene and 200 g of toluene as a solvent.

The reactor was cooled to −70° C. in a nitrogen atmosphere, whereupon vacuum deaeration and nitrogen blow were repeated three times. The reactor was warmed up to room temperature, 4.0 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 89 g of a white polymer. The polymer was dissolved in a mixture of 0.27 liter methanol and 0.27 liter tetrahydrofuran again, to which 77 g of triethylamine and 14 g of water were added to effect deblocking reaction. The reaction solution was neutralized with acetic acid, concentrated, and dissolved in 0.5 liter of acetone. Following precipitation, filtration and drying in the same way as above, 57 g of a white polymer was obtained.

The polymer was analyzed by $^{13}$C-NMR, $^{1}$H-NMR and GPC, with the analytical results shown below.

Copolymer compositional ratio=hydroxystyrene:p-tert-amyloxystyrene:ethoxyethoxystyrene=74.0:22.0:4.0 Mw=16,200 Mw/Mn=1.78

This polymer is designated Poly-F.

Comparative Synthesis Examples

For comparison purposes, binary and ternary polymers were synthesized by the same procedure as the foregoing Synthesis Examples. Their composition and analytical results are shown below.

Copolymer compositional ratio=hydroxystyrene:tert-butoxystyrene=71:29 Mw=16,100 Mw/Mn=1.70

This polymer is designated Poly-G.

Copolymer compositional ratio=hydroxystyrene:tert-butoxystyrene:1-ethylnorbornyl methacrylate=75.9:18.8:5.3 Mw=16,700 Mw/Mn=1.75

This polymer is designated Poly-H.

Examples 1–6 & Comparative Examples 1–2

Resist compositions were prepared according to the formulation shown in Tables 1 and 2. The polymers are Poly-A to H obtained in the above Synthesis Examples and Comparative Synthesis Examples, and the remaining components listed in Tables 1 and 2 have the following meaning.

PAG1: (4-butoxyphenyl)diphenylsulfonium 10-camphorsulfonate
PAG2: (4-tert-butylphenyl)diphenylsulfonium 4-(4'-methylphenylsulfonyloxy)phenylsulfonate
Dissolution inhibitor A: bis(4-(2'-tetrahydropyranyloxy)phenyl)methane
Basic compound A: tris(2-methoxyethyl)amine
Surfactant A: FC-430 (Sumitomo 3M K.K.)
Surfactant B: Surflon S-381 (Asahi Glass K.K.)
Solvent A: propylene glycol methyl ether acetate
Solvent B: ethyl lactate

TABLE 1

| Component (pbw) | Example 1 | Example 2 | Example 3 | Example 4 |
|---|---|---|---|---|
| Poly-A | 80 | — | — | — |
| Poly-B | — | 80 | — | — |
| Poly-C | — | — | 80 | — |
| Poly-D | — | — | — | 80 |
| PAG1 | 2 | 2 | 2 | 2 |
| PAG2 | 1 | 1 | 1 | 1 |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

TABLE 2

| Component (pbw) | Example 5 | Example 6 | Comparative Example 1 | Comparative Example 2 |
|---|---|---|---|---|
| Poly-E | 80 | — | — | — |
| Poly-F | — | 80 | — | — |
| Poly-G | — | — | 80 | — |
| Poly-H | — | — | — | 80 |
| PAG1 | 2 | 2 | 2 | 1 |
| PAG2 | 1 | 1 | 1 | 1 |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

The resist solutions thus obtained were each filtered through a 0.2-μm Teflon filter. These resist solutions were spin-coated onto silicon wafers, then baked on a hot plate at 100° C. for 90 seconds to give resist films having a thickness of 0.4 μm. The resist films were exposed using an excimer laser stepper NSR2005EX (Nikon K.K., NA 0.6), then baked at 110° C. for 90 seconds (post-exposure baking: PEB), and developed with a solution of 2.38% tetramethylammonium hydroxide in water, thereby giving positive patterns (Examples 1–6 and Comparative Examples 1–2).

The resulting resist patterns were evaluated as described below.

Resist Pattern Evaluation

The exposure dose which provides a 1:1 resolution at the top and bottom of a 0.15-μm line-and-space pattern was the optimum exposure dose (sensitivity Eop). The minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PEB) after 24 hours of holding from exposure at the optimum dose and determining a variation in line width. The less the variation, the greater is the PED dimensional stability.

The results are shown in Table 3.

TABLE 3

| | Sensitivity (mJ/cm$^2$) | Resolution (μm) | Profile | PED stability (nm) |
|---|---|---|---|---|
| Example 1 | 28 | 0.13 | rectangular | −8 |
| Example 2 | 29 | 0.12 | rectangular | −6 |
| Example 3 | 29 | 0.12 | rectangular | −5 |
| Example 4 | 27 | 0.13 | intermediate concave | −5 |
| Example 5 | 29 | 0.12 | rectangular | −7 |
| Example 6 | 28 | 0.13 | rectangular | −12 |

TABLE 3-continued

| | Sensitivity (mJ/cm$^2$) | Resolution ($\mu$m) | Profile | PED stability (nm) |
|---|---|---|---|---|
| Comparative Example 1 | 35 | 0.15 | tapered | −8 |
| Comparative Example 2 | 32 | 0.15 | somewhat tapered | −14 |

There have been described resist compositions in which a polymer using tert-amyloxystyrene as a reactive group which is decomposable under the action of an acid to increase solubility in alkali is blended as the base resin. The compositions have advantages including a significantly enhanced contrast of alkali dissolution rate before and after exposure, a high sensitivity, and a high resolution in the baking temperature range of 100 to 110° C. which is unachievable with tert-butoxystyrene. The compositions are best suited as a chemically amplified resist material for micropatterning in the manufacture of VLSI.

Japanese Patent Application No. 2001-331757 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising a polymer comprising recurring units of the following general formula (1) and having a weight average molecular weight of 1,000 to 500,000,

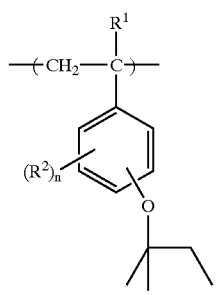

(1)

wherein $R^1$ is hydrogen, hydroxy, a straight or branched alkyl group, halogen atom or trifluoromethyl group, $R^2$ is hydrogen, hydroxy, a halogen atom or trifluoromethyl group, and n is 0 or a positive integer of 1 to 4, and a tertiary amine.

2. The resist composition of claim 1, wherein said tertiary amine is at least one selected from the group consisting of tertiary aliphatic amines, mixed amines, aromatic amines, heterocyclic amines and basic compounds of the following general formula (B)-1:

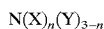

$N(X)_n(Y)_{3-n}$ wherein n is equal to 1, 2, or 3, Y is straight, branched or cyclic alkyl group of 1 to 20 carbon atoms which may contain a hydroxyl group or alkyl group, and X is independently selected from the groups of the following general formulas (X)-1 to (X)-3:

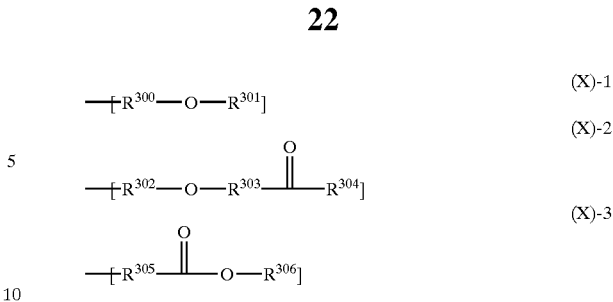

in which $R^{300}$, $R^{302}$ and $R^{305}$ are independently straight or branched alylene groups of 1 to 4 carbon atoms; $R^{301}$ and $R^{304}$ are independently hydrogen or straight, branched or cyclic alkyl groups of 1 to 20 carbon atoms, which may contain 1 or more hydroxyl, ether, ester groups or lactone rings; $R^{303}$ is a single bond or a straight or branched alkylene group of 1 to 20 carbon atoms which may contain one or more hydroxyl, ether, ester groups or lactone rings.

3. A process for forming a resist pattern comprising the steps of:

applying the resist composition of claim 1 onto a substrate to form a coating, heat treating the coating and then exposing it to high-energy radiation or electron beam through a photo mask, and optionally heat treating the exposed coating and developing it with a developer.

4. A resist composition comprising a polymer comprising recurring units of the following general formula (2) and having a weight average molecular weight of 1,000 to 500,000,

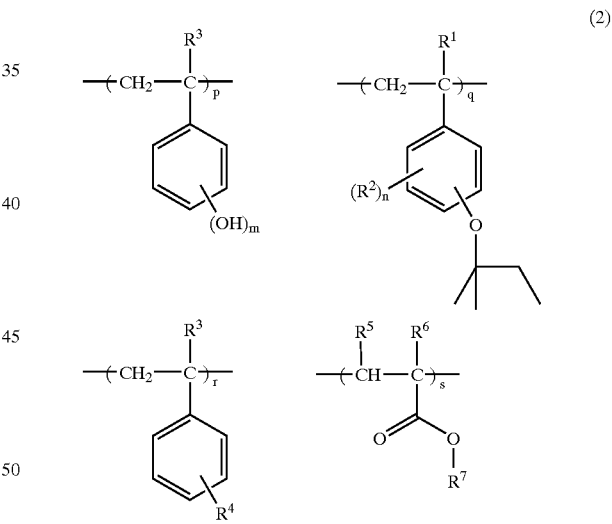

(2)

wherein each of $R^1$ and $R^3$ is hydrogen, hydroxy, a straight or branched alkyl group, halogen atom or trifluoromethyl group, $R^2$ is hydrogen, hydroxy, a halogen atom or trifluoromethyl group, $R^4$ is hydrogen, halogen atom, trifluoromethylhydroxymethyl group or —OR, R is a straight, branched or cyclic alkyl group which may contain a hetero atom, alkoxyalkyl group, alkoxycarbonyl group or trialkylsilyl group, $R^5$ is hydrogen or methyl, $R^6$ is hydrogen, methyl, alkoxycarbonyl group, cyano group, halogen atom, or trifluoromethyl group, $R^7$ is a straight, branched or cyclic alkyl group of 4 to 30 carbon atoms, n is 0 or a positive integer of 1 to 4, m is 0 or a positive integer of 1 to 5, r is 0 or a positive number, and each of p, q and s is a positive number, and a tertiary amine.

5. The resist composition of claim 4, wherein said tertiary amine is at least one selected from the group consisting of tertiary aliphatic amines, mixed amines, aromatic amines, heterocyclic amines and basic compounds of the following general formula (B)-1:

$N(X)_n(Y)_{3-n}$ wherein n is equal to 1, 2 or 3, Y is a straight, branched or cyclic alkyl group of 1 to 20 carbon atoms which may contain a hydroxyl group or ether group, and X is independently selected from groups of the following general formulas (X)-1 to (X)-3:

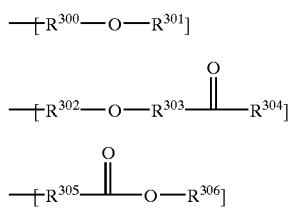

in which $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

6. A process for forming a resist pattern comprising the steps of:
  applying the resist composition of claim 4 onto a substrate to form a coating,
  heat treating the coating and then exposing it to high-energy radiation or electron beam through a photo mask, and
  optionally heat treating the exposed coating and developing it with a developer.

7. A chemically amplified positive resist composition comprising:
  (A) an organic solvent,
  (B) a polymer comprising recurring units of the general formula (1)

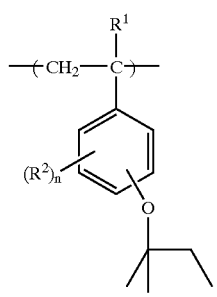

wherein $R^1$ is hydrogen, hydroxy, a straight or branched alkyl group, halogen atom or trifluoromethyl group, $R^2$ is hydrogen, hydroxy, a halogen atom or trifluoromethyl group, and n is 0 or a positive integer of 1 to 4 or general formula (2)

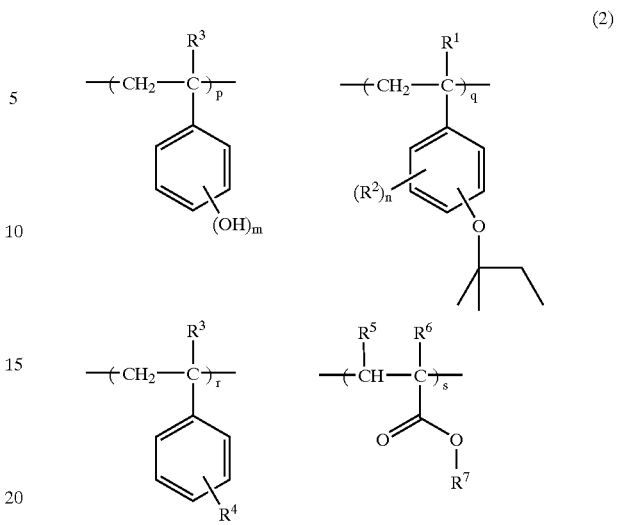

wherein each of $R^1$ and $R^3$ is hydrogen, hydroxy, a straight or branched alkyl group, halogen atom or trifluoromethyl group, $R^2$ is hydrogen, hydroxy, a halogen atom or trifluoromethyl group, $R^4$ is hydrogen, halogen atom, trifluoromethylhydroxymethyl group or —OR, R is a straight, branched or cyclic alkyl group which may contain a hetero atom, alkoxyalkyl group, alkoxycarbonyl group or trialkylsilyl group, $R^5$ is hydrogen or methyl, $R^6$ is hydrogen, methyl, alkoxycarbonyl group, cyano group, halogen atom, or trifluoromethyl group, $R^7$ is a straight, branched or cyclic alkyl group of 4 to 30 carbon atoms, n is 0 or a positive integer of 1 to 4, m is 0 or a positive integer of 1 to 5, r is 0 or a positive number, and each of p, q and s is a positive number,
  (C) a photoacid generator, and
  (D) a tertiary amine.

8. The resist composition of claim 7, wherein said tertiary amine is at least one selected from the group consisting of tertiary aliphatic amines, mixed amines, aromatic amines, heterocyclic amines and basic compounds of the following general formula (B)-1:

$N(X)_n(Y)_{3-n}$ $N(X)_n(Y)_{3-n}$ wherein n is equal to 1, 2 or 3, Y is a straight, branched or cyclic alkyl group of 1 to 20 carbon atoms which may contain a hydroxyl group or ether group, and X is independently selected from groups of the following general formulas (X)-1 to (X)-3:

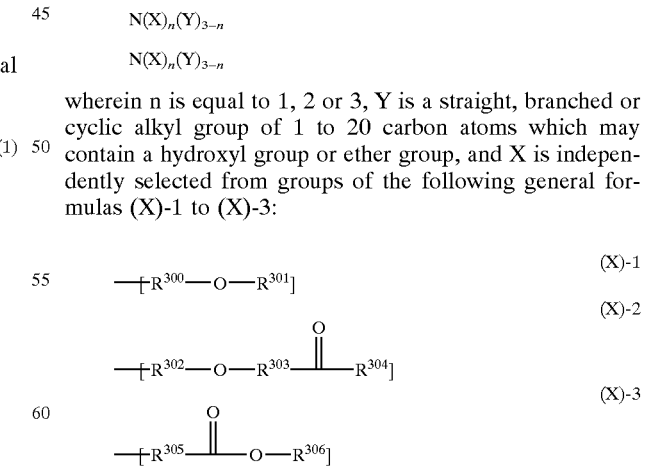

in which $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{305}$ is a straight, branched or cyclic alkyl group of 1 to 20 carbon atoms which may contain one or more hydroxyl, ether, ester groups or lactone rings.

9. A process for forming a resist pattern comprising the steps of:
   applying the resist composition of claim 7 onto a substrate to form a coating,
   heat treating the coating and then exposing it to high-energy radiation or electron beam through a photo mask, and
   optionally heat treating the exposed coating and developing it with a developer.

10. A chemically amplified positive resist composition comprising
    (A) an organic solvent,
    (B) a polymer comprising recurring units of the general formula (1)

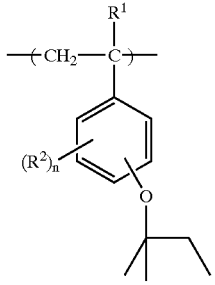

(1)

wherein $R^1$ is hydrogen, hydroxy, a straight or branched alkyl group, halogen atom or trifluoromethyl group, $R^2$ is hydrogen, hydroxy, a halogen atom or trifluoromethyl group, and n is 0 or a positive integer of 1 to 4, or general formula (2)

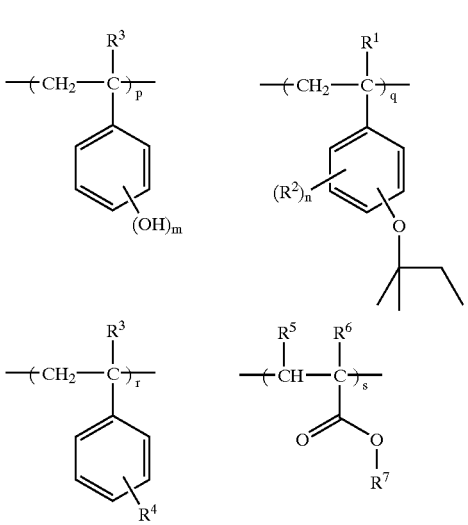

(2)

wherein each of $R^1$ and $R^3$ is hydrogen, hydroxy, a straight or branched alkyl group, halogen atom or trifluoromethyl group, $R^2$ is hydrogen, hydroxy, a halogen atom or trifluoromethyl group, $R^4$ is hydrogen, halogen atom, trifluoromethylhydroxymethyl group or —OR, R is a straight, branched or cyclic alkyl group which may contain a hetero atom, alkoxyalkyl group, alkoxycarbonyl group or trialkylsilyl group, $R^5$ is hydrogen or methyl, $R^6$ is hydrogen, methyl, alkoxycarbonyl group, cyano group, halogen atom, or trifluoromethyl group, $R^7$ is a straight, branched or cyclic alkyl group of 4 to 30 carbon atoms, n is 0 or a positive integer of 1 to 4, m is 0 or a positive integer of 1 to 5, r is 0 or a positive number, and each of p, q and s is a positive number,
    (C) a photoacid generator,
    (D) a dissolution inhibitor, and
    (E) a tertiary amine.

11. The resist composition of claim 10, wherein said tertiary amine is at least one selected from the group consisting of tertiary aliphatic amines, mixed amines, aromatic amines, heterocyclic amines and basic compounds of the following general formula (B)-1:

$$N(X)_n(Y)_{3-n}$$

wherein n is equal to 1, 2 or 3, Y is a straight, branched or cyclic alkyl group of 1 to 20 carbon atoms which may contain a hydroxyl group or ether group, and X is independently selected from groups of the following general formulas (X)-1 to (X)-3:

 (X)-1

 (X)-2

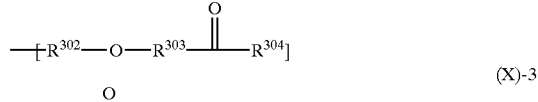 (X)-3 in which $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

12. A process for forming a resist pattern comprising the steps of:
    applying the resist composition of claim 10 onto a substrate to form a coating,
    heat treating the coating and then exposing it to high-energy radiation or electron beam through a photo mask, and
    optionally heat treating the exposed coating and developing it with a developer.

* * * * *